United States Patent [19]
Cipolla et al.

[11] Patent Number: 5,421,079
[45] Date of Patent: Jun. 6, 1995

[54] HIGH DENSITY, HIGH PERFORMANCE MEMORY CIRCUIT PACKAGE

[75] Inventors: Thomas M. Cipolla, Katonah; Paul W. Coteus, Yorktown Heights; Alphonso P. Lanzetta, Marlboro, all of N.Y.

[73] Assignee: International Business Machines Corporation, Armonk, N.Y.

[21] Appl. No.: 148,970

[22] Filed: Nov. 8, 1993

Related U.S. Application Data

[60] Division of Ser. No. 922,257, Jul. 30, 1992, Pat. No. 5,268,815, which is a continuation of Ser. No. 836,673, Feb. 14, 1992, abandoned.

[51] Int. Cl.⁶ ............................................. B23P 19/04
[52] U.S. Cl. ............................................. 29/760
[58] Field of Search .................. 29/467, 468, 740, 758, 29/760, 834, 840; 228/180.2; 439/69, 70

[56] References Cited

U.S. PATENT DOCUMENTS

| | | | |
|---|---|---|---|
| 4,007,479 | 2/1977 | Kowalski | 29/760 |
| 4,520,555 | 6/1985 | Gyi et al. | 29/467 X |
| 4,547,794 | 10/1985 | Tang | 29/760 |
| 4,979,663 | 12/1990 | Sofia et al. | 228/180.2 |
| 5,046,953 | 9/1991 | Shreeve et al. | 29/840 X |
| 5,085,362 | 2/1992 | Art et al. | 29/840 X |
| 5,175,410 | 12/1992 | Freedman et al. | 29/760 X |

FOREIGN PATENT DOCUMENTS 63-31146  2/1988  Japan ........................ 29/760

*Primary Examiner*—Peter Dungba Vo
*Attorney, Agent, or Firm*—Perman & Green

[57] ABSTRACT

A high density circuit package includes a pair of planar packages, the planar packages exhibiting front and back surfaces and positioned back-to-back in the high density circuit package. Each planar package includes a flexible circuit carrier having a plurality of circuit chips mounted thereon. Front and back planar metallic heat sinks sandwich the circuit carriers, at least one of the heat sinks contacting a surface of the chips mounted on the sandwiched circuit carriers. Each heat sink is provided with air flow apertures formed in its planar surface and adjacent to each circuit chip. A circuit card interconnects with the circuit carriers in an interconnection region and is pluggable into a female connector. The planar metallic heat sinks and circuit carriers are mechanically packaged so as to provide a planar arrangement which aligns the apertures in both the front and rear heat sinks. A pair of planar packages are mechanically connected in a back-to-back arrangement so that the apertures therebetween are aligned. The associated circuit cards are also back-to-back oriented so as to enable their joint interconnection into the female connector.

5 Claims, 8 Drawing Sheets

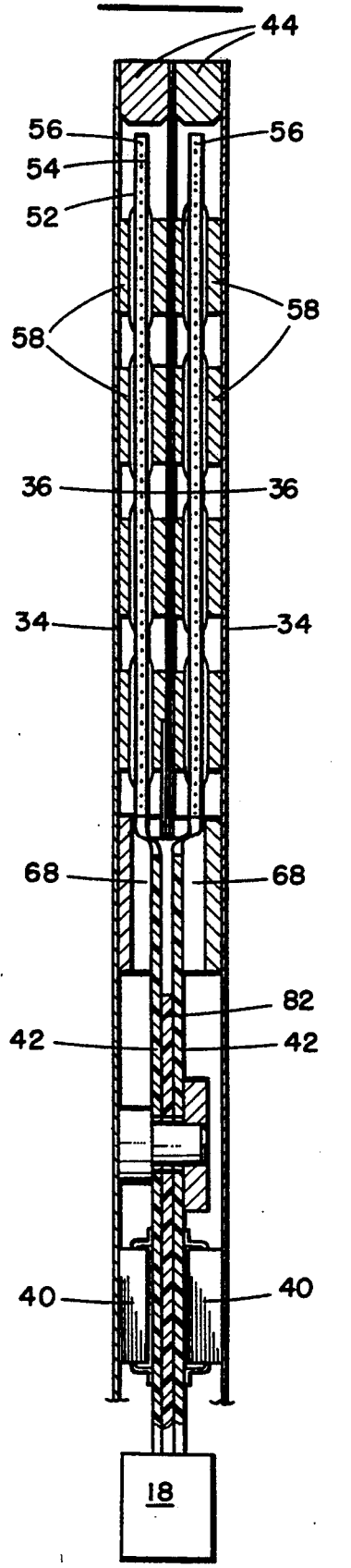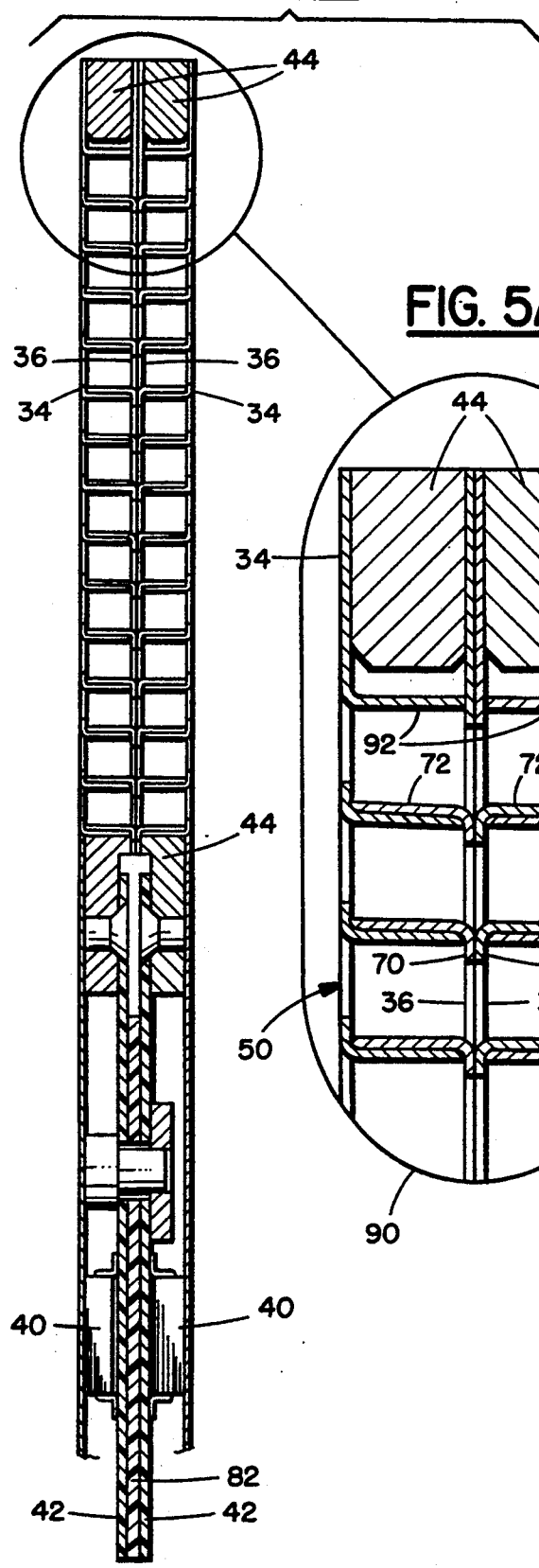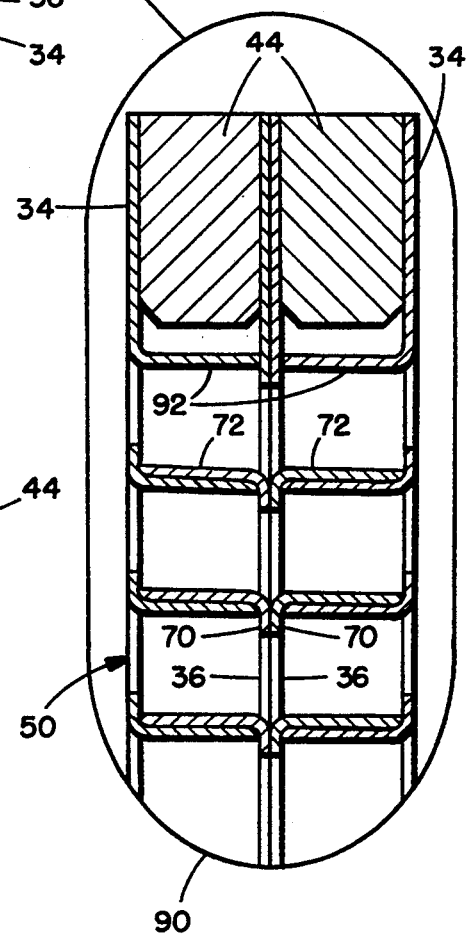

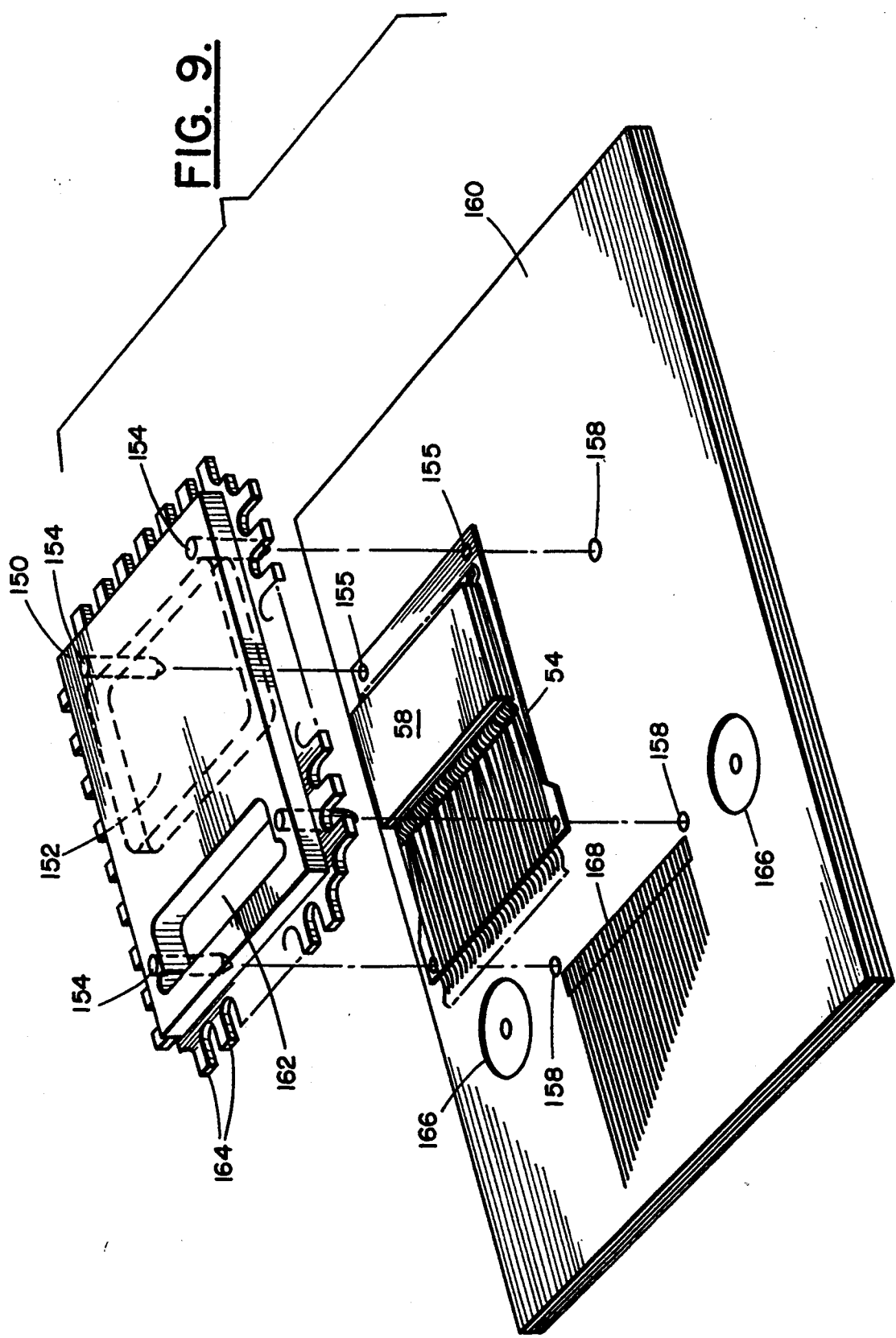

HIGH DENSITY, HIGH PERFORMANCE MEMORY CIRCUIT PACKAGE

This application is a division of Ser. No. 07/922,257, filed Jul. 30, 1992, now U.S. Pat. No. 5,268,815, which was a continuation of Ser. No. 07/836,673, filed Feb. 14, 1992, now abandoned.

CROSS-REFERENCE TO RELATED APPLICATION

This application ms related to "MULTI-CHIP MODULE," of T. M. Cipolla et al., U.S. Pat. No. 5,208,729, the disclosure of on Feb. 14, 1992, which is hereby incorporated by reference.

FIELD OF THE INVENTION

This invention relates to microelectronic packaging and, more particularly, to a high density, multi-chip package having improved heat dissipation.

BACKGROUND OF THE INVENTION

To reap the benefits of increased component densities in memory chips, it is necessary to increase the packing density of the package which holds the memory chips. This is especially so with respect to the highest density, dynamic random access memory chips (DRAM's) now commercially available. DRAM chips have traditionally been packaged as single chip modules. That is, a single silicon die has been wire bonded to a lead frame containing wiring that fans out the necessary signals to and from the chip via a set of individual metal leads. Those leads are then connected to an underlying circuit board. The lead frame and silicon chip are usually encased in an epoxy block, from which the individual metal leads extend, such package generally being referred to as a wire bond package.

Once the chips have been packaged, they are subjected to a process known as burn-in, whereby they are operated for many hours at elevated temperatures and voltages. Packaged chips which survive the burn-in operation are then assembled into groups of chips which, in turn, are assembled into groups of groups, etc. Additionally, other components of the memory system such as control logic, error correction logic, etc., are added to the package. Characteristically, such packaging results in large and cumbersome systems which are not suitable for the highest performance DRAM memories.

A preferred package for DRAM memories is the TAB package (Tape-Automated-Bonding). TAB packages are inexpensive to produce, and, recently, machines have become available that automatically handle such packages. A TAB package comprises a film of an insulating material, e.g., Kapton, (a trademark of the DuPont Corporation, Wilmington, Del.) with personalized copper wiring patterns positioned either on one or both of its opposing surfaces. A memory chip (either "bare" or "encapsulated") is emplaced on a surface of the film and the chip's conductors are interconnected with pro-positioned conductive pads. Once the chip is bonded, the film is cut into sections, each section having "outerlead" bpnd areas that may, in turn, be interconnected with a further circuit carrier.

When DRAM circuits are packaged as single-chip modules, those modules are mounted in groups on circuit cards and then the circuit cards are placed together to make a memory system. In addition to the DRAM circuits, other components such as decoupling capacitors, control logic, error correction logic and line drivers are added to make a complete system. In general, the packaging of such systems lacks a common heat sink. Thus memory circuits that are frequently accessed in such packages become the hottest part of the system and are prone to thermal stress failure.

The prior art is replete with designs for high density packaging. Examples of some of these prior art teachings can be found in the following patents. In U.S. Pat. No. 4,730,232 to Lindberg, a pair of device-containing circuit boards are laminated to planar heat sinks, which heat sinks are mounted back-to-back and are enclosed within a pair of covers. In U.S. Pat. No. 4,122,508 to Rumbaugh, a separate heat sink is attached to each of a plurality of printed circuit boards, each heat sink having a plurality of fins integrally formed therein. When a number of these heat sinks are mounted on a face-to-face basis, continuous air circulation paths are formed that enable cooling of the attached circuit boards.

In U.S. Pat. No. 4,771,366 to Blake et al., a plurality of parallel-oriented ceramic card assemblies with interspersed cold plates are described. Each ceramic card has a number of chips mounted on both of its sides, which chips are enclosed by conductive caps that, in turn, bear upon the cold plates. In U.S. Pat. No. 4,841,355 to Parks, a high density package is shown having internal pathways for a liquid coolant flow. In U.S. Pat. No. 3,372,310 to Kantor, a high density package is shown wherein a plurality of chips are mounted on a substrate, an apertured spacer emplaced thereover, and the entire configuration is enclosed within metallic coverplates.

A number of prior art references disclose parallel-mounted circuit cards with pathways provided therebetween for cooling airflow. Such structures can be found in U.S. Pat. Nos. 4,107,760 to Zimmer; 4,674,004 to Smith et al.; 4,375,290 to Zucchi et al.; 4,291,364 to Andros et al.; 4,739,444 to Zushi et al.; and 3,671,812 to Peluso et al. Other liquid and liquid/air flow cooling systems can be found in U.S. Pat. Nos. 4,619,316 to Nakayama et al. and 4,315,300 to Parmerlee et al. Other multi-chip integrated circuit packaging configurations can be found in the following patents: U.S. Pat. No. 4,783,695 to Eichelberger et al.; U.S. Pat. No. 4,580,193 to Edwards; U.S. Pat. No. 4,549,200 to Ecker et al.; U.S. Pat. No. 4,868,634 to Ishida et al.; U.S. Pat. No. 4,831,433 to Ogura et al.; and U.S. Pat. No. 4,782,381 to Ruby et al.

The following patents describe methods for providing via-connections to opposite sides of a circuit board: U.S. Pat. No. 4,830,264 to Bitaillou et al.; U.S. Pat. No. 3,991,347 to Hollyday; U.S. Pat. No. 4,835,344 to Iyogi et al.; U.S. Pat. No. 4,838,475 to Mullins et al.; German patent DE 37 39 985 A1 to Inoue et al. and IBM Technical Disclosure Bulletin, Vol. 10, No. 7, December 1967 (Ecker) p. 943.

SUMMARY OF THE INVENTION

It is an object of this invention to provide an improved, high density, electronic package capable of handling high levels of power dissipation.

It is another object of this invention to provide a high density electronic package that is adapted to contain a plurality of different types of basic circuit packages.

It is still another object of this invention to provide a high density electronic package that may be efficiently cooled.

It is a further object of this invention to provide an improved, high density, electronic package that efficiently conducts internally generated heat to its external surfaces for dissipation.

It is yet another object of this invention to provide a high density electronic package that employs low inductance wiring and exhibits improved electromagnetic shielding.

A high density circuit package includes a pair of planar packages, the planar packages exhibiting front and back surfaces and positioned back-to-back in the high density circuit package. Each planar package includes a thin circuit carrier having a plurality of circuit chips mounted thereon. Front and back planar metallic heat sinks sandwich the circuit carriers, at least one of the heat sinks contacting a surface of the chips mounted on the sandwiched circuit carriers. Each heat sink is provided with air flow apertures formed in its planar surface and adjacent to each circuit chip. A circuit card interconnects with the circuit carriers in an interconnection region and is pluggable into a female connector. The planar metallic heat sinks and circuit carriers are mechanically packaged so as to provide a planar arrangement which aligns the apertures in both the front and rear heat sinks. A pair of planar packages are mechanically connected in a back-to-back arrangement so that the apertures therebetween are aligned. The associated circuit cards are also back-to-back oriented so as to enable their joint interconnection into the female connector.

DESCRIPTION OF THE DRAWINGS

FIG. 4 is a sectional view of the high density circuit package of FIG. 2 taken along line 4—4.

FIG. 5 is a sectional view of the high density circuit package of FIG. 2 taken along line 5—5.

FIG. 5A is a magnified view of a portion of FIG. 5.

FIG. 9 illustrates an exploded view of a fixture for attaching a circuit carrier (flex circuit) to an underlying circuit card.

DETAILED DESCRIPTION OF THE INVENTION

Figure 1:
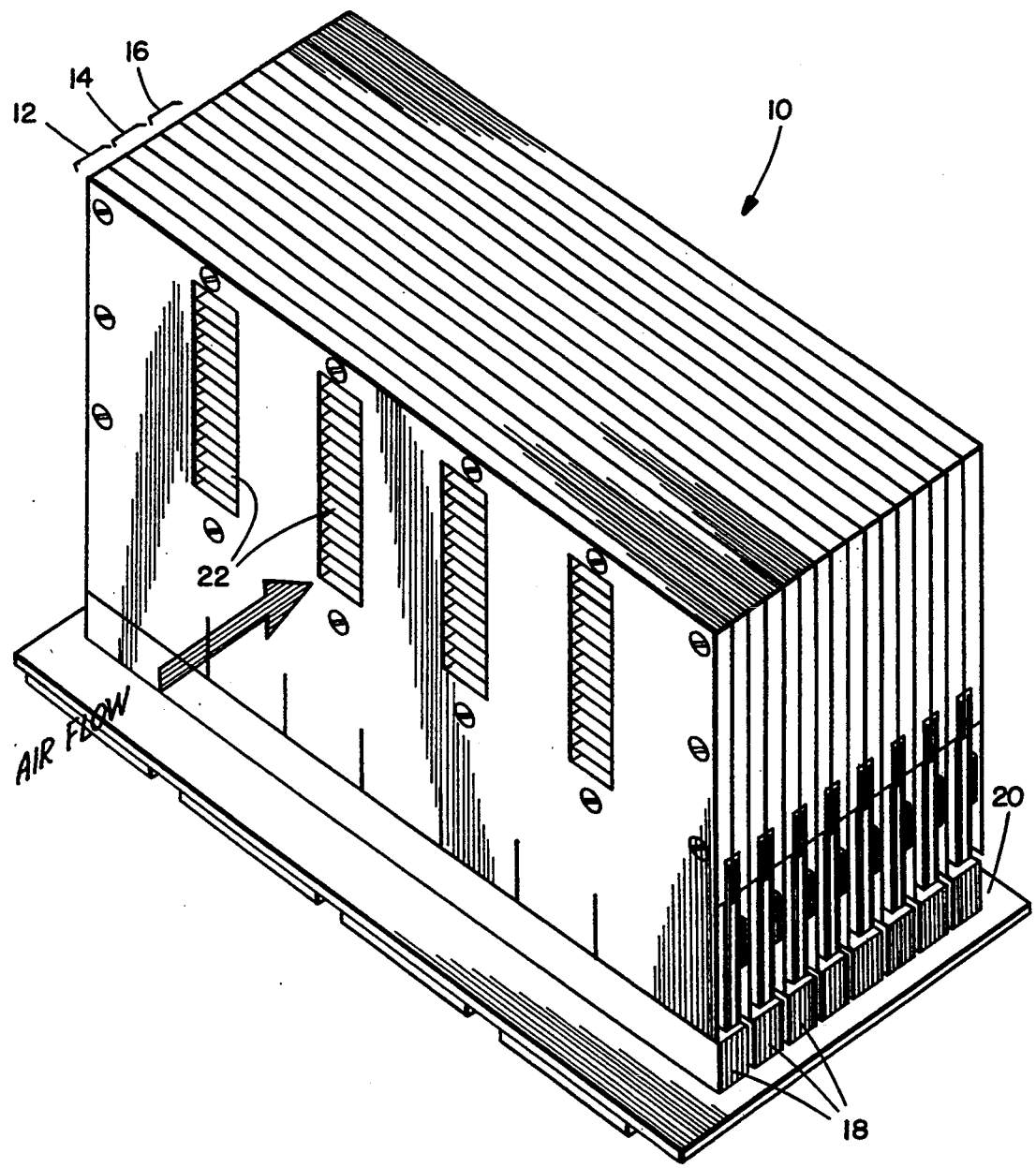
FIG. 1 is a perspective view of a high density memory module that incorporates a plurality of high density circuit packages constructed in accordance with the invention hereof.

Referring now to FIG. 1, a memory module 10 is shown that comprises a plurality of high density circuit packages 12 14, 16, etc. Each of the high density circuit packages is planar in nature and stacks in a sandwich-like fashion. Each high density circuit package is pluggable into a female connector 18, which is in turn mounted on a mother board 20. On the underside of mother board 20 are chips and circuit components that control the operation of memory module 10.

As will be hereinafter understood, each high density circuit package 12, 14, 16, etc. is provided with a plurality of apertures 22 through which air flow can be directed and which provide heat exchange properties for the electronic circuits contained within module 10. Apertures 22 are present in each of circuit packages 12, 14 and 16 and are aligned so that continuous air channels are provided through memory module 10.

Memory module 10 will be hereinafter described in the context of a DRAM system, although it is to be understood that the illustrated package arrangement has general applicability. In the embodiment shown in FIGS. 1, etc., an eight-high memory package is shown, with each circuit package having 32 four megabit DRAM chips, to form a 256 megabyte memory system.

Figure 2:
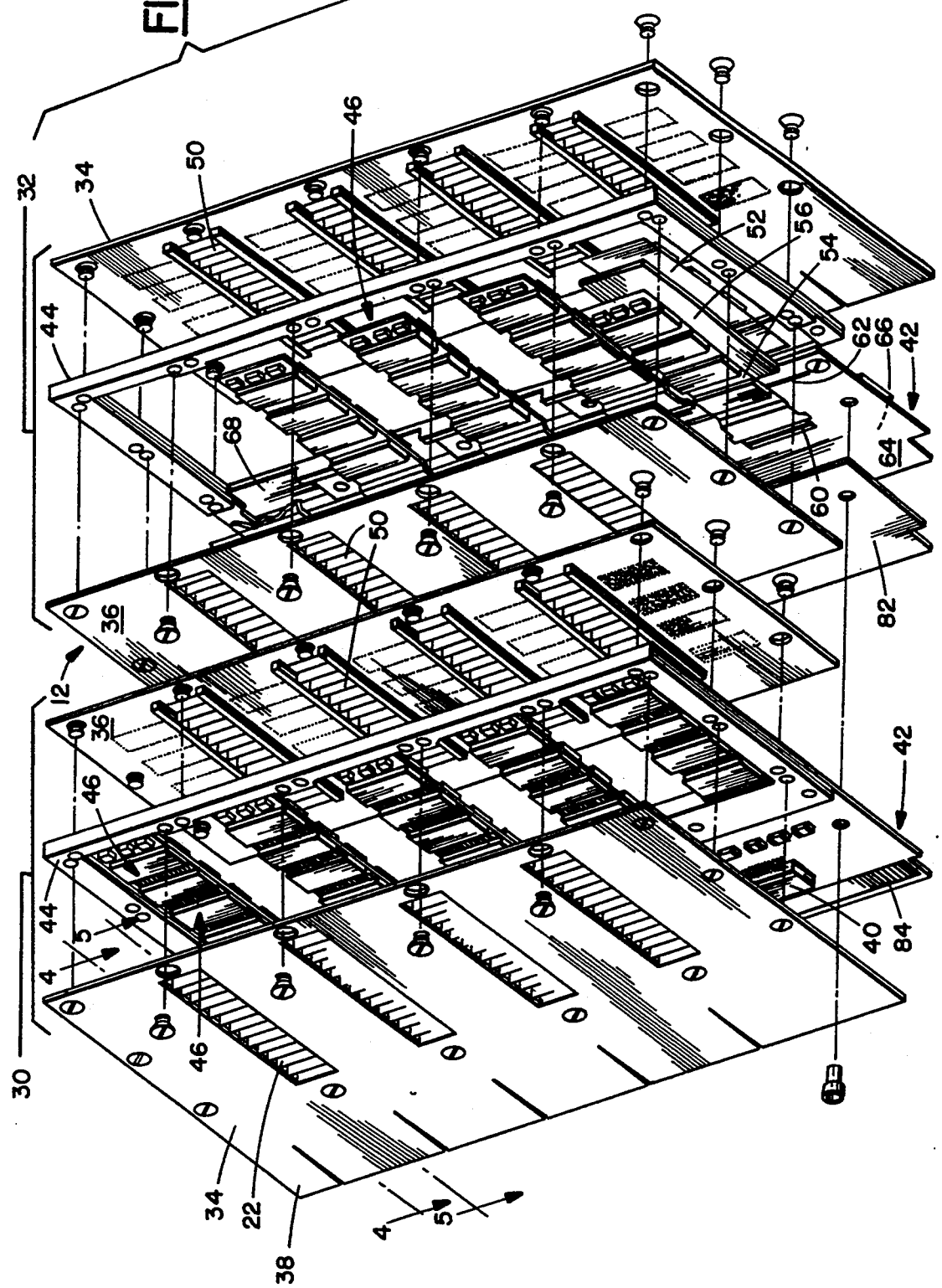
FIG. 2 is a high density circuit package shown in exploded form.

Referring to FIG. 2, an exploded view is shown of high density circuit package 12 from FIG. 1. It is to be noted that each high density circuit package is identical and the description of high density circuit package 12 is equally applicable thereto. Each high density circuit package comprises two identical planar packages 30 and 32. Each planar package (e.g. 30) includes a front cover plate 34 and a rear cover plate 36. Front cover plate 34 includes a skirt section 38 which covers a plurality of driver and other control circuits 40 that are mounted on a circuit card 42. Positioned between front cover plate 34 and rear cover plate 36 is a frame 44. A plurality of circuit carriers 46 are mounted in the interior of frame 44, positioned to allow unimpeded air flow between air flow apertures 22 in front cover plate 34 and air flow apertures 50 in rear cover plate 36.

Details are shown in FIG. 2 of each circuit carrier 46 (see planar package 32). A circuit carrier 46 comprises a pair of flex circuits 52 and 54, that are separated by an elastomer sheet 56. Each flex circuit (e.g. 54) has mounted thereon a plurality of memory circuits 58 and associated components (e.g. decoupling capacitors). Flex circuit 54 has an interconnection region 60 that connects with interconnection area 62 on the rear face 64 of circuit board 42. In a similar manner, flex circuit 52 is provided with an interconnection region (not shown) which connects to a similar interconnection area on front face 66 of circuit board 42. The bottom portion of frame 44 is provided with a plurality of reduced cross-section regions 68 that allow the passage of the interconnection region of a flex circuit 52 therethrough.

Figure 6:
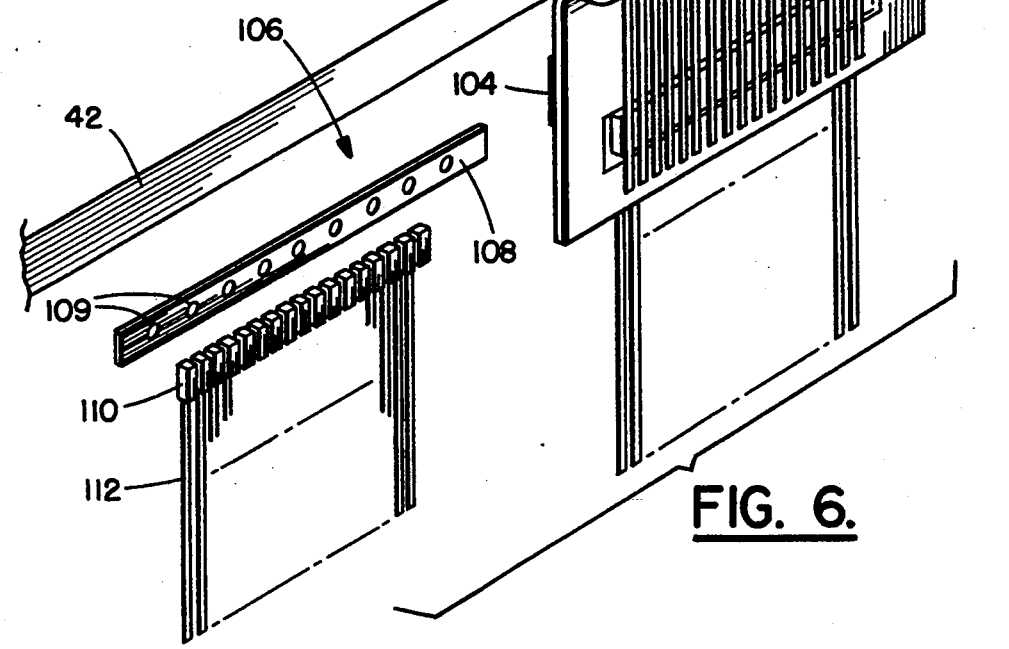
FIG. 6 is a perspective view indicating how a flex circuit is interconnected with a circuit card within the high density circuit package.

Each flex circuit (e.g. 54) comprises a thin film composite that includes two layers of copper wiring, one mostly ground on the underside of the flex circuit, and the other mostly power and signal lines on the chip-bearing side of the flex circuit. A thin polymeric material provides an insulating surface between the circuit layers. Additional details regarding the method of interconnection of the circuit layers to circuit card 42 will be discussed hereinbelow when FIG. 6 is considered.

Chips 58 are connected to flex strip 54 using conventional surface-mount technology. Thus, a screened solder can be used and reflowed in an infrared conveyor oven. Other surface mount techniques are also useable herewith. During assembly, flex circuits 52 and 54 are packaged together with an interposed flexible elastomer sheet 56, to form a sandwich arrangement. They are then laid in frame 44, positioned such that they lie between apertures 22 and 50 in front cover plate 34 and rear cover plate 36 respectively.

Figures 3, 3A:
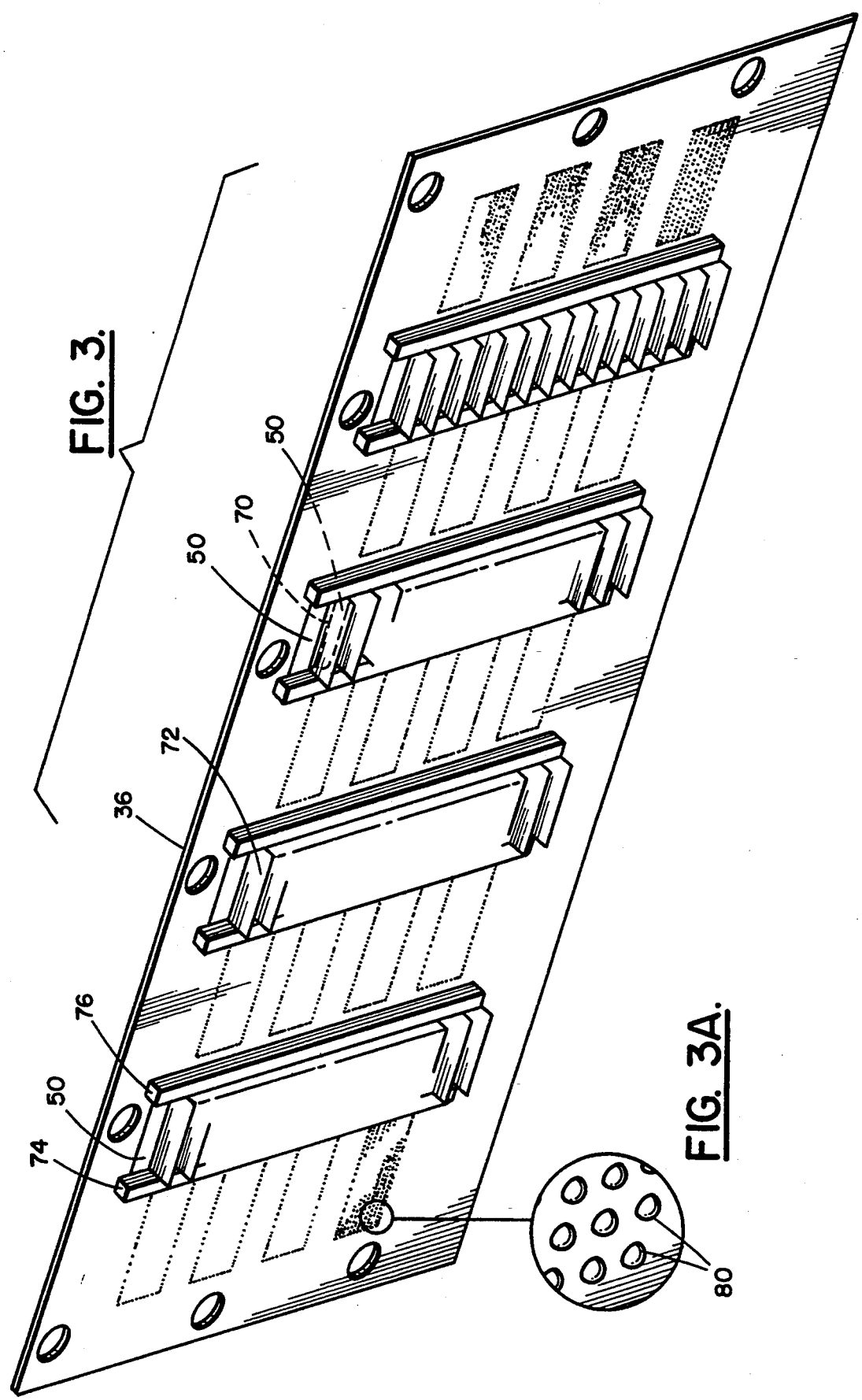
FIG. 3 is a perspective view of a cover plate employed as a heat sink with the high density circuit package.
FIG. 3A is a magnified view of a portion of FIG. 3.

Referring to FIG. 3, a perspective is shown of rear cover plate 36. Apertures 50 are formed by stamping or cutting a plurality of polygonal openings, with the cuts being separated so that a cross member 70 remains between apertures 50. The resulting flanges 72 are then bent inwardly to approximately a 90° angle with respect to cover plate 36 to create an aperture 50. While not shown, each flange that is created in a front cover plate 34 is produced in exactly the same manner, except that cross member 70 is left at the upper extent of an aperture 50 and the resulting flange is bent upwardly therefrom. Thus, rear cover plate 36 has flanges bent down from the bottom of apertures 50, whereas front cover plate 34 has flanges 70 bent up from the top of corresponding apertures 50. Then, when a rear and front cover plate are brought together, flanges 70 from each of the cover plates provide top and bottom air flow channeling members for each aperture 50.

A pair of ribs 74 and 76 are positioned on either side of each series of aperture 50. Ribs 74 and 76 provide both mechanical support for front and rear cover plates 34 and 36 and further, create additional thermal conduction along a thin circuit to carry excess heat into the respective cover plate. Ribs 74 and 76 are sufficiently thin so as not to contact a mating rib on a mating heat sink (i.e., they are less than one half the height of the flange). Since only one chip in a strip is generally accessed at a time, ribs 74 and 76 spread its heat vertically through the entire height of the cover plate to enable optimum cooling.

When front and rear cover plates 34 and 36 are brought together to enclose circuit carriers 46, the space between the backs of the chips or chip modules and the non-apertured sections of the cover plates can vary and, at times, result in no contact being present between a chip and a cover plate. To prevent this occurrence, the areas of contact between the cover plates and the chip or chip modules are coated with a thermally conductive elastomer gel. The elastomer gel is deposited (e.g. screened) upon the inward facing surface of a cover plate (e.g. see FIG. 3A) as a series of bumps or mounds 80. To allow for the greatest variation in the size of the gap between a chip face and cover plate, the elastomer gel is applied to the cover plate in the form of small droplets. The height of a bump created by a droplet should be higher than the maximum gap between a chip and a cover plate so that all bumps are compressed when the cover plates are brought together to form an integral package. The lateral dimensions of each bump should be as small as possible, so that under severe compression (as occurs during compression to the minimum gap size), the elastomer gel material can expand in a transverse direction without being unduly constrained by surface adhesion to the chip or heat sink or by an adjacent bump of elastomer gel.

A preferred composition for the thermal elastomer gel is Dow-Corning X3-6656 thermal paste (84% ZnO+16% silicone oil). The inclusion therewith of a small amount of a crosslinkable silicone (e.g. General Electric RTV-6186) prevents spreading of the paste after appropriate cure. The crosslinkable silicone material, after curing, maintains the thermal gel in a soft form that will deform/reform under temperature cycling with no loss of material and will, further, conform to irregular surfaces. A tack-free bump results after curing. The cured gel is adhered to the substrate upon which it was deposited, i.e., cofer plate 36.

The above described thermal elastomer gel was employed with a heat sink used to simultaneously contact 20 chips. The chips were 7 mm×14 mm, and the range of gaps between the heat sink and the chip was 50 microns to 100 microns. Droplets of dimensions 125 microns high by 0.5 mm square were screened onto the heat sink on a 1 mm grid. After screening, the thermal elastomer gel was cured. The thermal gel was prepared by mixing a crosslinkable silicone with a thermal paste. For example, one part of a crosslinkable silicone, (RTV-6186) was mixed with 10 parts of thermal paste (DC X3-6656). The mixture was then applied and cured for 15 minutes at 150° C. The Shore A hardness was approximately 20. The hardness can be modified by varying the cure conditions. For example, a cure of 4 hours at 65° C. yielded a Shore A hardness of about 5. The thermal conductivity of the cured gel is primarily a function of the thermal conductivity of the paste. For example, Thermagon-402A thermal paste can be substituted for the DC X3-6656, with approximately a doubling of the thermal conductivity of the cured gel. The cured material could be reworked in methyl ethyl ketone at room temperature with a time dependent on the ratio of crosslinkable silicone to paste, the cure conditions, and the type of surface it was applied to. The range of rework time was one to five hours.

Returning now to FIG. 2, it can be seen that each of planar packages 30 and 32 provides a complete package for a series of circuit carriers 46. A planar package (e.g. 30) is assembled by the indicated screw fittings (or other connection), a rigid package is formed. The assembly of a planar package causes chips 58 to be compressed (also compressing elastomer sheet 56) by abutting cover plates 34 and 36 and thermal gel bumps 80.

Intimate contact therebetween is thus assured. Once the individual planar packages are formed, they are placed back-to-back and are connected together so that circuit cards 42 are brought together in a back-to-back fashion, with an insulating interface 82 positioned therebetween. Each of circuit cards 42 is provided with a series of pluggable conductive lands 84. Thus, when cards 42 are fastened together, conductive lands 84 form a two-sided male connector which can be inserted into a receiving female connector 18 (see FIG. 1).

Turning now to FIGS. 4 and 5, sections of an assembled planar package 30 are shown taken along lines 4—4 and 5—5 in FIG. 2. FIG. 4 illustrates a section of planar packages 30 and 32, after assembly, with the section being taken through chips 58.

As can be seen, elastomer sheet 56 not only maintains a separation between flex circuits 52 and 54 but also tends to press chips 58 against the respectively abutting cover plates (and interposed thermal gel bumps). Likewise, it can be seen how circuit cards 42, together, form a single insert into female connector 18, thereby reducing the number of required connectors by a factor of two.

FIG. 5 is a section taken through apertures 50 in the assembled package. The expanded view 90 (FIG. 5A) illustrates the relative positions of flanges 72 and cross members 70 that extend from a rear cover plate 36. Flanges 92, that are bent from front cover plate 34 are shown forming the upper extents of the air pathways formed by apertures 50.

Turning now to FIG. 6, a preferred arrangement is shown for connecting a flex circuit (e.g. 54) to a circuit card 42. As above described, flex circuit 54 has on its upper surface, a plurality of signal lines 100 that are to be interconnected with a plurality of pads on circuit card 42. On the rear face of flex circuit 54 is a ground plane 102 which terminates at approximately a point indicated by 104. To the left of flex circuit 54 is a connection area 106 on circuit card 42 that has no flex circuit connected thereto. A ground plane connection strip 108 is provided with a plurality of vias 109 that connect strip 108 to a ground plane within circuit card 42. Solder is screened or otherwise deposited on surface of connection strip 108.

A plurality of bonding pads 110 are provided on card 42 that connect to circuit lines 112. A solder paste is screened onto bonding pads 110 to a height that is sufficient to extend through window 114 in flex circuit 54 and to contact conductors 100 on a lower surface thereof. Thus, when flex circuit 54 is in place over connection strip 108 and bonding pads 110, and a reflow procedure is performed, both signal and ground connections are simultaneously made.

The above described interconnection technique enables a continuation of the signal transmission characteristics of flex circuit 54 to be extended onto card 42. A discontinuity is avoided as a result of the continuation of the ground plane immediately beneath connection strip 108 within card 42. The resulting electrical connection is a continuous micro-strip line for all signal lines 100. The bending of flex circuit 54, in the region of the interconnection area, enables strain relief to be provided to the arrangement.

If the circuit package shown in FIGS. 1 and 2 is employed for a less-demanding memory application, memory chips 58 may be emplaced on a single-sided flex circuit, wherein all signal, power and ground lines are present on a flex circuit's lower surface. When connecting such an arrangement to a circuit card (e.g. 42) individual lead lines are required to be visualized by an automatic assembly viewing system. In the past, the flex circuit's insulating sheet has been etched away from the copper lines, to leave just the copper lines for viewing. Such bare lead lines then are bonded to pad areas on circuit card 42 to create signal line connections. However, the bare copper conductors exhibit a low strength characteristic and are subject to breakage in normal handling.

Figure 7A:
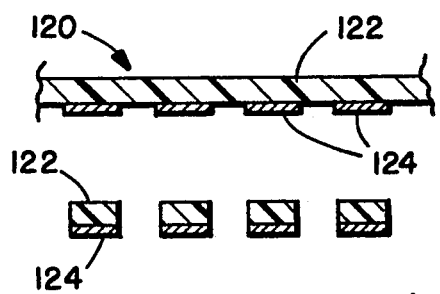
FIGS. 7A and 7B indicate the process steps for achieving dielectric-covered interconnecting lines for a circuit carrier.
Figure 7B:
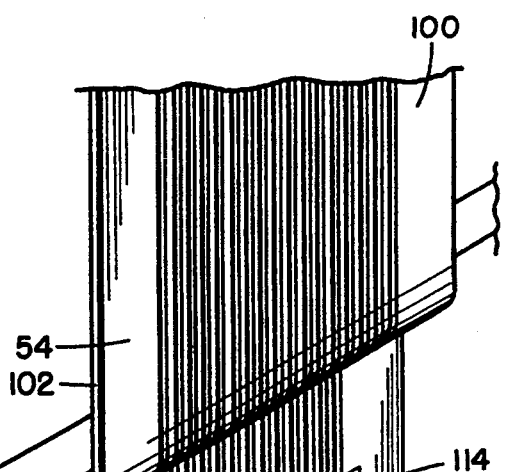

In FIG. 7(a) a section of a flex circuit 120 is shown comprising an insulating sheet 122 and copper signal and ground conductors 124. As aforesaid, the normal procedure is to etch away the entire insulating sheet 122 prior to connecting conductors 124 to pads on a circuit card. It has been found however, that if insulating sheet 122 is left in place over conductors 124, and is etched away therebetween to enable visualization of the individual conductors, that greatly improved strength characteristics result at the bond site. This procedure is accomplished by etching the regions of insulating sheet 122 between conductors 124 (using conductors 124 as an etch resist to enable selective removal of insulating sheet 122, see FIG. 7B).

Figure 8A:
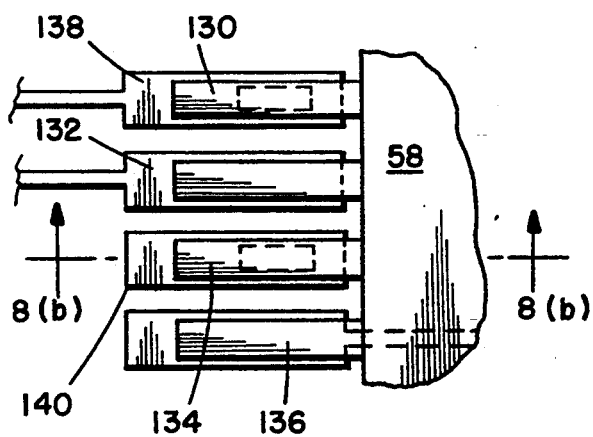
FIG. 8(a) is a top view of a surface mounted chip on a circuit carrier.
Figure 8B:
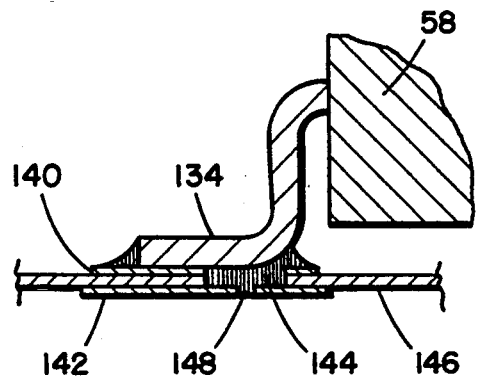
FIG. 8(b) is a section taken through FIG. 8a along line 8b—8b.

Turning now to FIGS. 8(a) and 8(b), a technique is shown for making contact between leads of a chip module 58 and pads on an underlying metallization level in a flex circuit, without using plated-through vias. In FIG. 8(a), chip module 58 is provided with a plurality of beam leads 130, 132, 134 and 136. Beam leads 130 and 134 are soldered to underlying metallization pads 138 and 140, which have apertures formed therein that connect to a lower metallization layer. The details of such an interconnection arrangement are shown in FIG. 8(b). Connection is assured to the lower bond pad 142 by providing aperture 144 through upper conductor layer 140 and insulating sheet 146. A small orifice 148 is provided in lower bond site 142.

When solder is reflowed, it flows into aperture 144 and extends through orifice 148. This action enables connections to be made between leads of chip module 58 and lower bond site 142, without the need of a plated-through via. The provision of orifice 148 assures that gases produced during soldering are vented, since the presence of lead 134 occludes aperture 144. Upper metallization 140 provides intimate contact and mechanical support for chip 58, while lower metallization level 142 is connected electrically by the solder to beam lead 134, provides a visual confirmation that the solder has wetted the lower level metallization 142 and enables a lower level test point to be provided for access by a test system.

Turning now to FIG. 9, a fixture is shown for emplacing a flex circuit 54 with one or more bonded chip modules 58 onto a circuit card 160. The view is schematic and shows only a single module 58 bonded to a flex circuit 54. It will be clear to those skilled in the art, that fixture 150 can be expanded to encompass the placement of a flex circuit containing additional chip modules.

Fixture 150 includes an underlying aperture 152 for receiving chip module 58. A plurality of alignment pins 154 extend downwardly, passing through alignment holes 155 in flex circuit 54, and mate with receiving holes 158 in circuit card 160. An aperture 162 in fixture 150 enables the viewing of the bond area, as well as the application of a heat blast to enable solder reflow to occur at the lead bond sites. A plurality of protrusions 164 are placed about the periphery of fixture 150 to enable it to be properly located by a viewing system with respect to fiducials 166 on circuit card 160. In operation, module 58 and flex circuit 54 are held by fixture 150 and the combination is then brought into contact with bond areas 168 on circuit card 160. A blast of hot air is directed through apertures 162 to cause solder reflow. Other possible bonding processes include laser reflow, infrared reflow and hot bar fellow. Alternatively, solder paste may be screened onto bond pads 168 and the aligned assembly of fixture 150 and flex circuit 54 bonded in a reflow process. In this instance viewing window 162 is not required.

Figure 10:
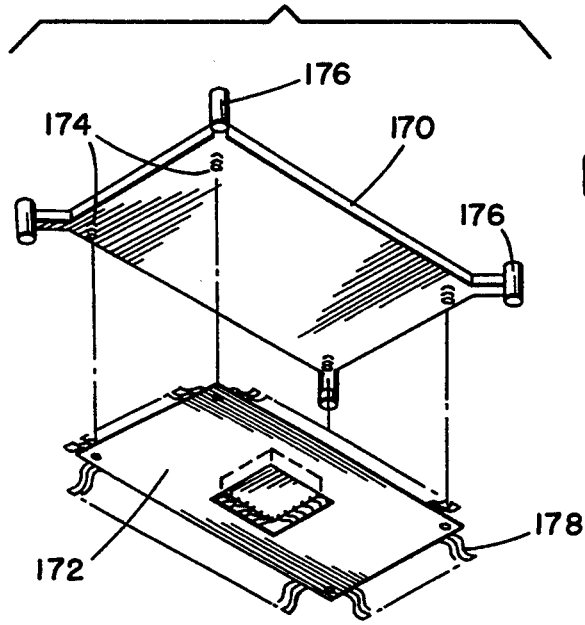
FIG. 10 illustrates an exploded view of a TAB package and fixture that is employed for emplacing the TAB package on a circuit carrier.
Figure 11:
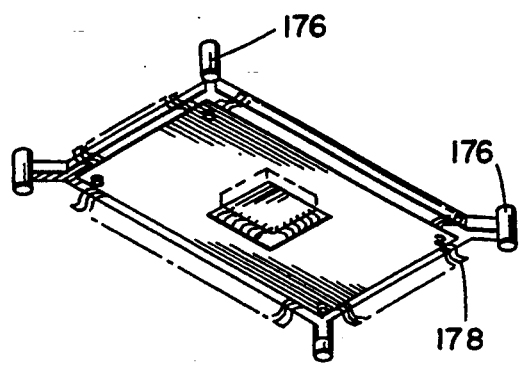
FIG. 11 is an assembled view of FIG. 10.

The above noted fixturing procedure can be applied to other TAB packaging systems. For instance, in FIGS. 10 and 11 a fixture 170 is shown that mates with a TAB package 172 via alignment posts 174. The diameters of alignment posts 174 are sized such that they exhibit a slight interference fit with the alignment holes in the TAB package. This enables a retention of joinder therebetween until after bonding. The assembled structure can be seen in FIG. 11, Standoffs 176 enable the assembly to be brought down upon a circuit board for bonding, with the proper height being maintained so that bent beam leads make contact with bond sites and enable a subsequent solder reflow.

Figure 13:
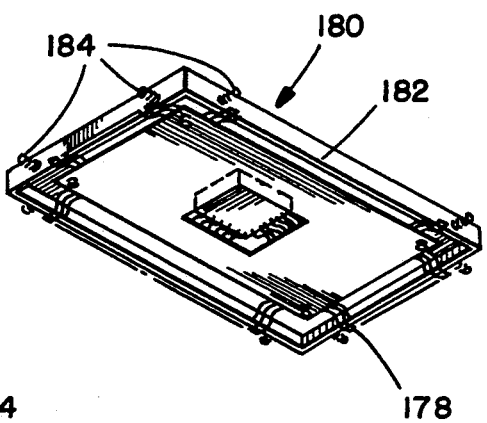
FIG. 13 is an assembled view of FIG. 12.
Figure 12:
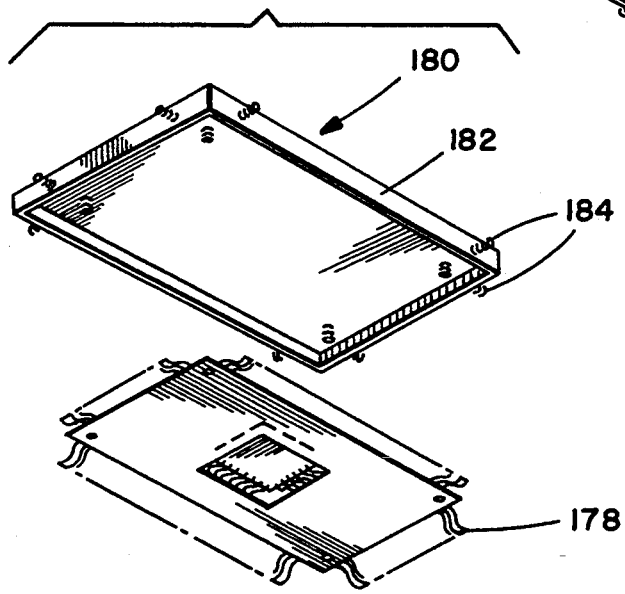
FIG. 12 is an exploded view of alternate fixture arrangement for emplacing a TAB package on a circuit carrier.

In FIGS. 12 and 13, an altered fixture 180 is shown that includes a frame portion 182 which provides support for bent leads 178 and drives them into contact with the solder. A plurality of external posts 184 are provided for viewing by an automatic positioning system, as the positions of leads 178 are hidden by fixture 180.

It will be understood, that in the case of computers with large DRAM based memory systems, accidental loss of power can cause considerable delay after power-up while the state of memory is regenerated. In some cases no recovery is possible. For this reason local battery backup, to create an uninterruptable power source, is often a part of the memory design. Space near the memory system must be created which allows unimpeded airflow while the memory system is under full power. Additionally, cooling air flow should be provided for the batteries, which heat up while they are being charged. It is necessary to find a compact, integrated packaging solution.

Figure 14:
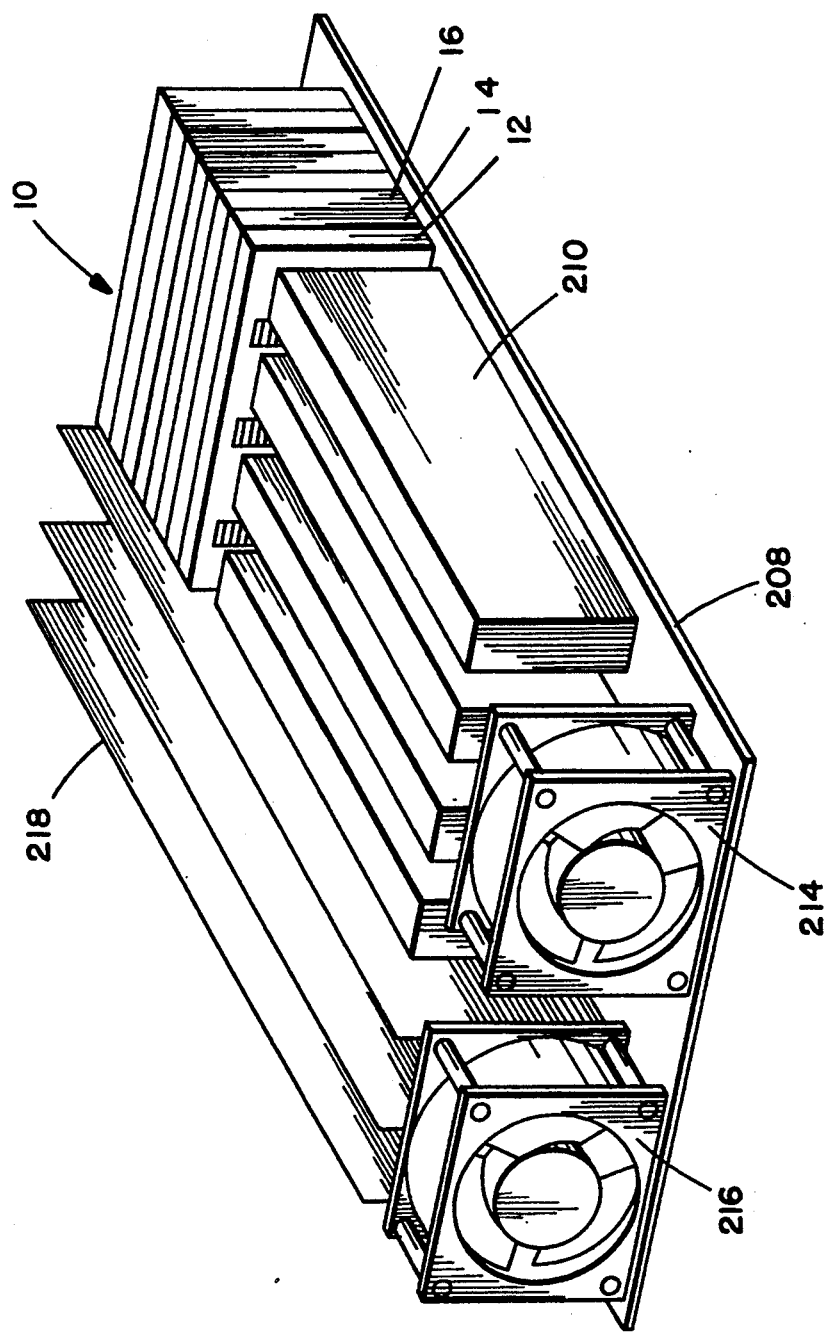
FIG. 14 shows a memory module, in accordance with the invention, arranged with other components associated with a memory system.

Referring to FIG. 14, elements of the power supply for an air cooled system are used to assist in the cooling of both the supply elements and the system devices being powered. A high density memory module 10 (including a plurality of circuit packages 12, 14, 16, etc.) in accordance with the invention, is mounted on a baseplate 208, along with a number of battery packs 210 which are arranged in an array which naturally matches the geometry of the circuit packages. The spaces between the battery packs 210 act as both a cooling channel for the batteries themselves, and as natural passages for the air required to cool the memory packages. The air is forced into the channels by a fan 214. The batteries can be either rectangular as shown (as is the case for certain lead-acid and Ni—Cd batteries) or stacks of cylindrical batteries which are available in a wide variety of sizes.

In the arrangement of FIG. 14, the cooling air is directed along channels which are an array of thin columns. The columns are aligned with air flow openings in the packages. The columns are approximately 10 mm wide while the space between columns is approximately 20 mm.

A separate fan 216 may be used to provide cooling to associated circuit boards 218 having control circuitry thereon.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A fixture for emplacing a TAB package, having a chip mounted thereon, onto a circuit carrier, said TAB package having alignment apertures positioned therein and exhibiting extending bent peripheral conductors which protrude beneath a planar surface of said TAB package, said fixture comprising:

a polygonal planar surface having alignment pins extending therefrom that mate with the alignment apertures in said TAB package; and stand-off means extending from said polygonal surface in a direction of protrusion of said bent peripheral conductors, said stand-off means positioned so as not to touch said conductors but to contact said circuit carrier when said fixture and a TAB package are brought into proximity to said circuit carrier, and to enable said peripheral conductors to contact conductive pads on said circuit carrier, without being substantially deformed.

2. The fixture as recited in claim 1 wherein said stand-off means are posts that extend from said polygonal planar surface.

3. The fixture as recited in claim 2 wherein said alignment pins have a diameter that enables an interference fit when inserted into said alignment apertures.

4. A fixture for emplacing a TAB package, having a chip mounted thereon, onto a circuit carrier, said TAB package having alignment apertures positioned therein and exhibiting extending bent peripheral conductors, said fixture comprising:

a polygonal planar surface having alignment pins extending therefrom that mate with the alignment apertures in said TAB package, said alignment pins having a diameter that enables an interference fit when inserted into said alignment apertures; and flange means extending about and protruding from said polygonal surface in a direction of said bent peripheral conductors, said flange means operative, when said fixture and a TAB package are brought into proximity to a circuit carrier, to enable said peripheral conductors to contact conductive pads on said circuit carrier, without being substantially deformed.

5. The fixture as recited in claim 4 wherein pins extend outwardly from said flange to enable alignment thereof by an automatic viewing/positioning system.

* * * * *